United States Patent [19]
Anthony

[11] Patent Number: 5,302,461
[45] Date of Patent: Apr. 12, 1994

[54] DIELECTRIC FILMS FOR USE IN MAGNETORESISTIVE TRANSDUCERS

[75] Inventor: Thomas C. Anthony, Sunnyvale, Calif.

[73] Assignee: Hewlett-Packard Company, Palo Alto, Calif.

[21] Appl. No.: 894,398

[22] Filed: Jun. 5, 1992

[51] Int. Cl.$^5$ ............................... G11B 5/30
[52] U.S. Cl. ................... 428/472; 360/113; 360/122; 428/701; 428/702
[58] Field of Search ............ 428/472, 701, 702; 360/113, 122

[56] References Cited

U.S. PATENT DOCUMENTS

| | | | |
|---|---|---|---|
| 3,860,965 | 1/1975 | Voegeli | 360/113 |
| 3,862,017 | 1/1975 | Tsunemitsu et al. | 204/15 |
| 4,012,781 | 3/1977 | Lin | 360/113 |
| 4,660,114 | 4/1987 | Yamakawa et al. | 360/122 |
| 4,853,080 | 8/1989 | Anthony | 156/655 |
| 4,940,511 | 7/1990 | Fontana, Jr. et al. | 156/656 |
| 5,110,637 | 5/1982 | Ando et al. | 428/702 |

FOREIGN PATENT DOCUMENTS 0013363 7/1980 European Pat. Off. .
0108940 5/1984 European Pat. Off. .
2091468A 7/1982 United Kingdom ......... G02F 1/135

OTHER PUBLICATIONS

N. Sangyo, "Thermo International Labratory", Nov. 11, 1991, Japanese Daily Report, p. 1.
K. Ramesh et al., "Process Dependence of Breakdown Filed in Thermally Nitrided Silicon Dioxide", Aug. 1991, Appl. Phys. 70(4), pp. 2299≧2303.
J. Yamazaki, "Highly stable tantalum thin Film CR Circuit on a Single Substrate", Dec. 1970, Fujitsu Scientific & Tech. Journal, pp. 117–133.
Patent Abstracts of Japan, vol. 16, No. 80, Feb. 26, 1992 & JP-A-32,68,216 Hitachi Ltd., Nov. 28, 1991.

*Primary Examiner*—A. A. Turner

[57] ABSTRACT

A new class of materials for use as a dielectric to separate various metallic layers within a magnetoresistive transducer. The materials include oxides of Ta, Hf, Zr, Y, Ti, or Nb. Thin films of these materials, when fabricated in accordance with the teachings of the invention, constitute dielectric films which maintain their integrity as insulators at thicknesses down to 5 nm. Additionally, the adhesion of this class of dielectrics equals or exceeds that of commonly used dielectrics.

3 Claims, 1 Drawing Sheet

5,302,461

DIELECTRIC FILMS FOR USE IN MAGNETORESISTIVE TRANSDUCERS

BACKGROUND OF THE INVENTION

1. Technical Field

The present invention relates to magnetoresistive transducers. More particularly, the present invention relates to a class of materials used as a dielectric to separate various metallic layers within a magnetoresistive transducer.

2. Description of the Prior Art

Magnetoresistive (MR) transducers for sensing a magnetic flux produced by a moving medium are known. A dual stripe MR transducer is described in U.S. Pat. No. 3,860,965, issued to Voegeli. Such dual stripe MR transducer design is currently considered state of the art because it produces the largest output per unit track width, has a low noise level due to common mode rejection, and provides linear and symmetric off-track response.

In a transducer constructed in accordance with such design, two closely spaced MR stripes are sensed differentially. The close spacing of the MR stripes is desirable as it allows greater storage capacity on a magnetic medium that is to be read by the transducer. In addition, the proximity of the two stripes is required so that the proper biasing condition can be established without exceeding the current density limit of the magnetoresistive stripes.

If the dual stripe MR design is to function properly the two MR stripes must be electrically isolated from one another, at least at one end of the pair. Otherwise, the stripes would be shorted together, thereby rendering the transducer inoperable.

In some MR transducer designs it is also useful to employ equally small distances between the MR stripes and adjacent ferromagnetic shields. Again, to produce a useful MR transducer, the MR stripes must be close to the shields and yet remain electrically isolated from the shields.

FIG. 1 shows a perspective view of a dual stripe MR transducer of the type disclosed in the '965 patent. In FIG. 1, a first MR device is shown, consisting of conductive leads 10,11 which are spaced apart along an axis of the first MR stripe 14 to provide a gap 15. The gap defines an active area corresponding to the read track width of the media to be read by the transducer.

In dual stripe MR transducer designs, a second device having conductive leads 12,13 spaced apart along an axis of the second MR stripe 18 to form a gap 15a is provided in parallel with the first element.

FIG. 2 is a cross-sectional view of a dual stripe MR transducer showing the active area of the transducer. Thus, portions of the two MR stripes 14,18 are shown in a parallel spaced relation to one another. The spacing 16 between the stripes is maintained by an interMR dielectric 20. Additional dielectrics 22,24 space the MR stripes from ferromagnetic shields 25,26. An air bearing surface 27 is provided by which the transducer floats over a magnetic storage medium that is being read by the transducer.

In operation, current is introduced into the conductors in the direction indicated by the arrows $i_1, i_2$. These currents are propagated along the MR stripes and serve as both sense and bias currents. An instantaneous value of the magnetic flux from the portion of the medium which is moving proximate to the gap 15 at any given time is measured by the dual stripe transducer. Such flux value corresponds to bits of data stored on the medium.

While the '965 patent teaches a 30 nm separation between the MR stripes, there is no indication that such device was actually fabricated. In fact, maintaining electrical isolation across such small dielectric thicknesses has been a major impediment to the implementation of the dual stripe MR design. It has been the experience of researchers in the relevant art that reliably and reproducibly fabricating dual stripe MR heads with spacings of less than about 70 nm is exceedingly difficult. This is due to shorting between the two MR stripes, primarily as a result of process and material limitations.

All of the teachings to date concerning dual stripe MR heads pertain to the use of sputtered $Al_2O_3$, $SiO_2$, or SiO as the inter-MR dielectric. Nonetheless, in practice these materials provide unacceptable isolation between the metallic layers within the MR head for dielectric thicknesses less than about 70 nm.

There is also some teaching in the semiconductor art to perform post-deposition processing of a thin film to improve the film dielectric properties. In such cases, gate dielectrics of $SiO_xN_y$ have been fabricated by exposing 5-10 nm $SiO_2$ films to nitrogen ambients at elevated temperatures for short periods of time. See, for example, *Process dependence of breakdown field in thermally nitrided silicon dioxide*, Ramesh et al, J. Appl. Phys. 70 (4), 1991.

It has also been proposed to use Ta oxide as a gate dielectric in 64 Mbit DRAMs. See, for example, *THERMCO INTERNATIONAL LABORATORY*, DR212.06, Japanese Daily Report, Nov. 12, 1991. In addition, it has been taught that $Ta_2O_5$ can be used as a capacitive dielectric in integrated circuit structures. See, for example, *Highly Stable Tantalum Thin Film CR circuit on a Single Substrate*, Yamazaki et al, FUJITSU Scientific and Technical Journal, December 1970. Such teachings are not particularly useful, by way of analogy, to the fabrication of MR stripes, which are generally formed of an NiFe film.

Thus, the full advantage of dual stripe MR transducer technology, i.e. extremely dense data storage on a magnetic medium, cannot be realized unless MR stripe spacings can be minimized. This, in turn, requires a new class of dielectric.

SUMMARY OF THE INVENTION

The present invention provides a class of materials useful as a dielectric that separates various metallic layers within a multilayer structure, such as a magnetoresistive transducer. The present invention provides extremely fine, high quality dielectric films having good reproducibility. These results are achieved by the deposition of a thin metal film upon a substrate. The film thus deposited provides a surface upon which an oxide is formed. The preferred embodiment of the invention provides for the use of thin films of various metals, which may include Ti, Ta, Hf, Zr, Y, or Nb. Thin films of these materials, when fabricated in accordance with the teachings of the invention, constitute dielectric films which maintain their integrity as insulators at thicknesses at 5 nm or less. Oxides are formed on these metal films by exposure to ambient conditions and/or oxidizing processes, such as exposure to a plasma, which may contain oxygen.

DETAILED DESCRIPTION OF THE INVENTION

Figure 1:
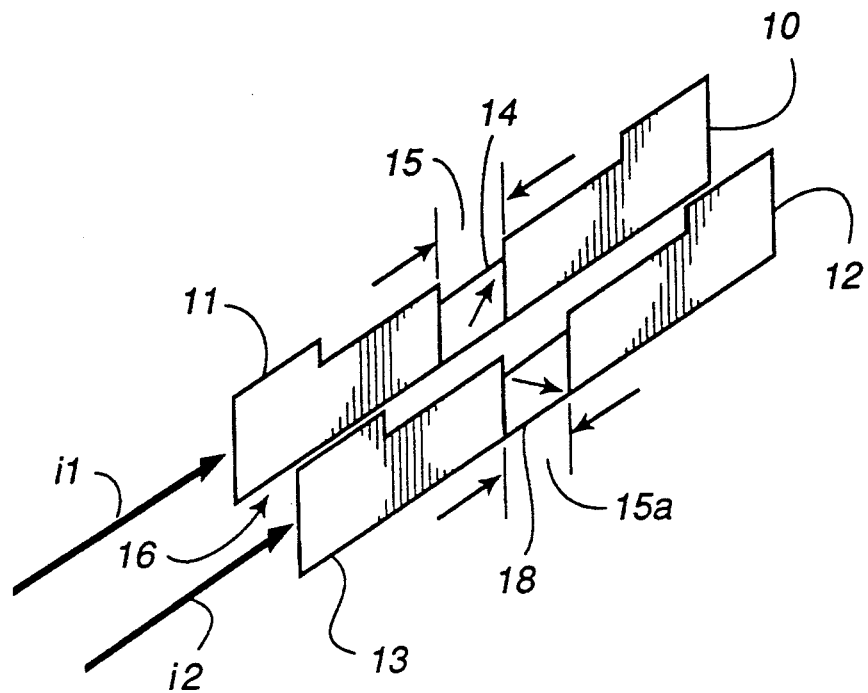
FIG. 1 is a perspective view of a prior art dual stripe MR transducer.
Figure 2:
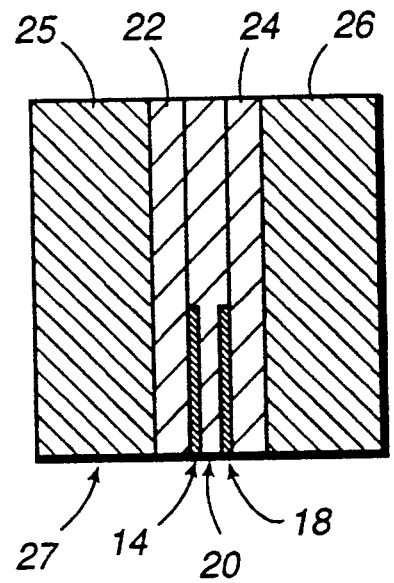
FIG. 2 is a cross-sectional view of a prior art dual stripe MR transducer, showing a section taken in the active area of the transducer.

The present invention is best understood by referring to the Drawings in connection with review of this Description. The present invention provides a class of materials useful as a dielectric that separates various metallic layers within a multilayer structure, such as a magnetoresistive transducer.

It is recognized in the art that certain metal films are highly susceptible to oxidation when exposed to air. In many cases, the thin layer of oxide formed in this manner is sufficient to create an effective (albeit often unintentional) insulating layer between the oxidized metal film and a subsequently deposited metal layer. The present invention exploits this property in providing a dielectric composed of an oxidized metallic film.

EXAMPLE

Nickel-iron(25 nm)/tantalum(15 nm) - NiFe/Ta - films were deposited onto a silicon wafer. The films were patterned into rectangles about 14×200 micrometers in size. After exposure to air for thirteen days, followed by a two-minute exposure to an oxygen plasma, tantalum/gold - Ta/Au - leads were deposited on either end of the rectangles by a lift-off process.

Three other silicon wafers were processed in a like manner, except that prior to Ta/Au lead deposition, the patterned NiFe/Ta film was argon ion etched for several minutes to remove any oxide layer on the surface of the Ta.

Resistances of the NiFe/Ta stripes having Ta/Au leads were then measured. NiFe/Ta stripes from the wafer that had not been argon ion etched had resistances that were uniformly greater than 10,000 Ohms, whereas the wafers that had been argon ion etched produced stripes that had resistances of about 15 Ohms.

Thus, the present invention teaches that ultrathin dielectrics (of no more than 5 nm in the preferred embodiment of the invention) may be created through oxidation of thin metal films. That is, the present invention exploits to good advantage the problem of oxidation in various metals that has plagued the industry for some time. Thus, where current teachings are to avoid such oxidation and to provide methods for such avoidance, the present invention relies on such oxidation to produce very thin dielectrics. These dielectrics, surprisingly, may be used to isolate the MR stripes in a dual stripe MR head.

The present invention provides a vast improvement in dielectric integrity of post-processed metal over that for traditional deposited dielectrics for at least the following reasons:

improved surface coverage of deposited metal vs. deposited dielectric films; and increase in effective volume of the deposited metal film upon subsequent oxidation.

The present invention relates to both the materials used as dielectrics in dual stripe MR heads, as well as to the manner in which those materials are fabricated. The preferred embodiment of the invention provides for the use of oxides of tantalum (Ta), hafnium (Hf), zirconium (Zr), niobium (Nb), titanium (Ti), or Yttrium (Y), none of which have heretofore been identified in the art as potential dielectrics for MR heads.

The preferred metals of the present invention have a strong affinity for oxygen and form stable, strongly adhered oxides. While these oxides could be deposited directly by known thin film deposition techniques, a preferred embodiment of the invention provides for fabricating the oxide by oxidizing a previously deposited thin metal film by exposure to oxygen either at elevated temperature, in a plasma, in the presence of UV light, or in any combination of these three. Experiments have shown that 5 nm of Ta can be effectively oxidized by either exposure to air at 300° C. or by exposure to an oxygen plasma.

In the event that such ultra-thin dielectrics are not desired, the foregoing process can also be employed by depositing a thin metal layer on top of a previously deposited dielectric, such as $Al_2O_3$, and then oxidizing the thin metal film. In this manner, thicker dielectrics can be achieved using the foregoing process, with a concomitant reduction in pinholes.

Although the invention is described herein with reference to the preferred embodiment, one skilled in the art will readily appreciate that other applications for the invention, may be substituted for those set forth herein without departing from the spirit and scope of the present invention. For example, the thin dielectric technology taught herein may be provided for use in the semiconductor arts, as well as the formation of MR transducers, without departing from the spirit and scope of the invention. Accordingly, the invention should only be limited by the claims included below.

I claim:

1. An electrical insulator for separating two electrically conductive layers in a magnetoresistive transducer, comprising an oxidized thin metal film selected from a group comprising Ta, Hf, Zr, Y, Ti, or Nb, wherein said thin metal film is first deposited on one conductive layer of said magnetoresistive transducer and then is oxidized after said deposition.

2. The material of claim 1, wherein said thin metal film is oxidized in a plasma containing oxygen.

3. The material of claim 1, wherein said metal film is oxidized through exposure of the film to elevated temperatures in the presence of oxygen.

* * * * *